United States Patent [19]

Yokota et al.

[11] Patent Number: 5,712,582
[45] Date of Patent: Jan. 27, 1998

[54] TEST SIGNAL GENERATOR HAVING TIMING CALIBRATION CIRCUIT

[75] Inventors: Shinichi Yokota, Gyoda; Toshiyuki Okayasu, Kurihashi-machi, both of Japan

[73] Assignee: Advantest Corporation, Tokyo, Japan

[21] Appl. No.: 667,399

[22] Filed: Jun. 21, 1996

[30] Foreign Application Priority Data

Jun. 22, 1995 [JP] Japan .................................. 7-179462

[51] Int. Cl.[6] ...................................................... H03L 7/08
[52] U.S. Cl. .............................................. 327/156; 327/158
[58] Field of Search ................................. 327/147, 149, 327/150, 152, 153, 155, 156, 158, 159, 161, 94, 95; 331/55, DIG. 2; 375/373, 375, 376

[56] References Cited

U.S. PATENT DOCUMENTS

| | | | |
|---|---|---|---|
| 4,680,621 | 7/1987 | Baker et al. | 327/156 |
| 4,868,514 | 9/1989 | Azevedo et al. | 327/159 |
| 4,908,841 | 3/1990 | Leis et al. | 375/81 |
| 5,223,755 | 6/1993 | Richley | 327/158 |
| 5,287,025 | 2/1994 | Nishimichi | 327/156 |
| 5,307,020 | 4/1994 | Marcuard | 327/156 |
| 5,428,309 | 6/1995 | Yamauchi et al. | 327/156 |
| 5,491,673 | 2/1996 | Okayasu | 327/158 |
| 5,557,648 | 9/1996 | Ishihara | 375/376 |

*Primary Examiner*—Timothy P. Callahan
*Assistant Examiner*—My-Trang Nu Ton
*Attorney, Agent, or Firm*—Muramatsu & Associates

[57] ABSTRACT

A timing signal generator generates timing signals having a timing resolution higher than a reference clock signal and can measure a delay time in the timing signal generator with high accuracy by a loop oscillation method. The timing signal generator includes: a phase lock loop having a variable delay circuit which is formed of a plurality of delay elements connected in series wherein a delay time in the variable delay circuit is phase locked with a clock signal, a track hold circuit provided in the phase lock loop to transfer a phase lock control voltage to the phase lock loop in a phase lock mode and to temporarily hold the control voltage in a loop oscillation mode, a selector circuit to select a timing signal from a plurality of signals corresponding to the plurality of delay elements to produce the timing signal at a timing output, an input selector for selectively providing the clock signal to the phase lock loop during the phase lock mode and a returning pulse from the timing output during the loop oscillation mode, and a pulse injection circuit for starting an oscillation in the closed loop by injecting a pulse signal in the closed loop.

7 Claims, 4 Drawing Sheets

FIG. I

TEST SIGNAL GENERATOR HAVING TIMING CALIBRATION CIRCUIT

FIELD OF THE INVENTION

This invention relates to a timing signal generator which generates timing signals having a timing resolution higher than a reference clock signal to be used for producing test signals for testing an IC device, and more particularly, to a timing signal generator which can measure a delay time in the timing signal generator with high accuracy by utilizing a loop oscillation method.

BACKGROUND OF THE INVENTION

In testing IC devices by an IC tester, test signals of various timings have to be produced for applying to each pin of the IC device. Such timing signals need to have high resolution to accurately test the IC device. Applicant of this invention filed a Japanese Patent Application Serial No. 6-1439950 for a timing signal generator which is capable of generating a timing signal having a timing resolution higher than a reference clock of the IC tester. The timing signal generator disclosed in the Japanese Patent Application is capable of generating timing signals having a timing difference which is smaller than one cycle of the reference clock signal. This invention is to improve the timing signal generator disclosed in the Japanese Patent Application to accurately measure and calibrate a delay time in the timing signal generator.

FIG. 4 is a block diagram showing a structure of timing signal generator disclosed in the Japansese Patent Application No. 6-143950. The timing signal generator is generally formed of a phase lock loop circuit 100 and a timing signal selection circuit 200. Each of the circuits will be explianed in the following.

The phase lock loop circuit 100 includes a variable delay circuit 120 having m variable delay elements $D_1$–$D_m$ connected in series which receives a clock signal, a phase comparator 140 which detects a phase difference between an output signal from the variable delay circuit 120 and the clock signal, a feedback circuit 150 which produces a delay time control signal based on an output of the phase comaprator 140 to control the delay time of the variable delay circuit 120.

In the phase lock loop circuit 100, because of the feedback loop which works to control the delay time of the variable delay circuit 120 to be equal to the clock signal based on the output of the phase comparator 140, the delay time of the variable delay circuit 120 becomes equal to one period of the clock signal. Thus, at each tap of the delay elements $D_1$–$D_m$, a signal having a delay time difference which is 1/m of the clock signal cycle will be obtained.

The timing signal selection circuit 200 includes a synchronous delay circuit 110 for receiving delay data which defines a timing of an output signal from the timing signal generator, and a decoder 160 which also receives the delay data, a selector circuit 130 having m selector gates $G_1$–$G_m$ to select one of m signals from the variable delay circuit 120 based on the selection signal from the decoder 160. In other words, each output of the delay elements $D_1$–$D_m$ is connected to an input of the corresponding selector gates $G_1$–$G_m$. The selector circuit 130 has an OR gate to receive one of the outputs of the selector gates $G_1$–$G_m$ and produce it as a timing output.

In the timing signal selection ciruclt 200, the synchronous delay circuit 110 outputs a large delay signal whose time interval is an integar multiple of the clock signal based on higher digits of the delay data. The large timing signal is provided to all of the selector gates $G_1$–$G_m$. The decoder 160 generates a selection signal to select one of the outputs of the delay elements $D_1$–$D_m$ based on lower digits of the delay data.

Accordingly, the timing signal generator generates a timing signal having a delay time which is a sum of the large delay signal (integar multiple of the clock period) and a small delay signal (integar multiple of 1/m clock period) at the output of the OR gate. The delay time in the varialbe delay circuit may change with the change of temperature, voltages and time. Thus, the example of FIG. 4 is considered to be a simple, accurate, and cost effective timing signal generator to maintain the accuracy of the timings to be used in a semiconductor test system such as an IC tester.

To measure a delay circuit with high accuracy and speed, a loop oscillation method of FIG. 5 is frequently used. In this loop oscillation method, a delay circuit 500 to be tested is included in a closed loop by, for example, operations of switches. A pulse injection circuit 300 is provided in the loop which initiates an oscillation in the loop. In this example, the pulse infection circuit 300 has an OR gate one input of which is connected to the closed loop while the other input is provided with an injection pulse.

As is well known in the art, once a single pulse is supplied to the OR gate, such a pulse signal comes back after a delay time determined by the delay circuit to be tested. The returned pulse signal excites the OR gate and again passes through the loop to come back to the OR gate. Thus, the loop oscillates by the frequency determined by the delay times of the delay circuit 500 and the pulse injection circuit 300. A frequency counter 320 counts the oscillation frequency F1 in the loop.

Then, the switch disconnects the delay circuit 500 and forms a closed loop without the delay circuit 500. The injection pulse is supplied to the loop to initiate the oscillation in the loop as described above and the oscillation frequency F2 in the loop is measured by the frequency counter 320. A calculation unit 330 obtains a delay time DT of the delay circuit 500 by calculating DT=(1/F1)−(1/F2). The calculated data is used to correct the delay time of the delay circuit 500 and stored in a data storage 340.

This loop oscillation method is considered to be a simple, accurate and cost effective way to measure the delay time of the delay circuit. Therefore, there is a need to use the loop oscillation method to measure the delay time of the timing signal generator, i.e., the variable delay circuit 120 of FIG. 4.

However, in the conventional circuit arrangement of FIG. 4, it is not possible to measure the delay time of the variable delay circuit 120 by the loop oscillation method. As noted above, the delay time of the variable delay circuit 20 is controlled by the phase lock loop to be synchronized with the clock signal. Thus, the delay time is controlled by the control signal from the phase comparator 140 and the feedback circuit 150 in the phase lock loop.

To oscillate in the closed loop including the variable delay circuit 120 for the loop oscillation method, the phase lock control must be disabled. If the phase lock loop is disconnected, the variable delay circuit 120 would be set to a differenct control voltage which is different from the actual setting in the phase lock loop. Therefore, the conventional timing signal generator of FIG. 4 is not applicable to the loop oscillation method for measuring the delay time.

SUMMARY OF THE INVENTION

It is, therefore, an object of the present invention to provide a timing signal generator having a variable delay circuit in a phase lock loop which is capable of measuring a delay time of the variable delay circuit by a loop oscillation method.

It is another object of the present invention to provide a timing signal generator having a variable delay circuit in a phase lock loop which is capable of measuring a delay time of the variable delay circuit with high accuracy in a short period of time with the use of a loop oscillation method.

The timing signal generator of the present invention generates timing signals having a timing resolution higher than a reference clock signal to be used for producing test signals for testing an IC device. The timing signal generator can measure a delay time in the timing signal generator with high accuracy by utilizing a loop oscillation method.

The timing signal generator of the present invention includes: a phase lock loop having a variable delay circuit which is formed of a plurality of delay elements connected in series wherein a delay time in the variable delay circuit is phase locked with a clock signal cycle, a track hold circuit provided in the phase lock loop to transfer a phase lock control voltage to the phase lock loop in a phase lock mode and to temporarily hold the control voltage in a loop oscillation mode, a selector circuit to select a timing signal from a plurality of signals corresponding to the plurality of delay elements in the variable delay circuit to produce the timing signal at a timing output, an input selector for selectively providing a clock signal to the phase lock loop during the phase lock mode and a returning pulse from the timing output during the loop oscillation mode to form a closed loop which includes the variable delay circuit, and a pulse injection circuit for starting an oscillation in the closed loop by injecting a pulse signal in the closed loop.

According to the present invention, the timing signal generator having the variable delay circuit in the phase lock loop has a loop oscillation mode in which the variable delay circuit is provided with the control voltage from the track hold circuit. The control voltage represents the same voltage value of the phase lock loop to attain the same delay time in the varible delay circuit as the delay time in the phase lock mode.

Therefore, the timing signal generator of the present invention is capable of measuring the delay time of the variable delay circuit by the loop oscillation method. Further, the timing signal generator of the present invention is able to measure the delay time of the variable delay circuit with high accuracy in a short period of time with the use of the loop oscillation method.

DETAILED DESCRIPTION OF THE PREFERRED EMBODIMENT

Figure 1:
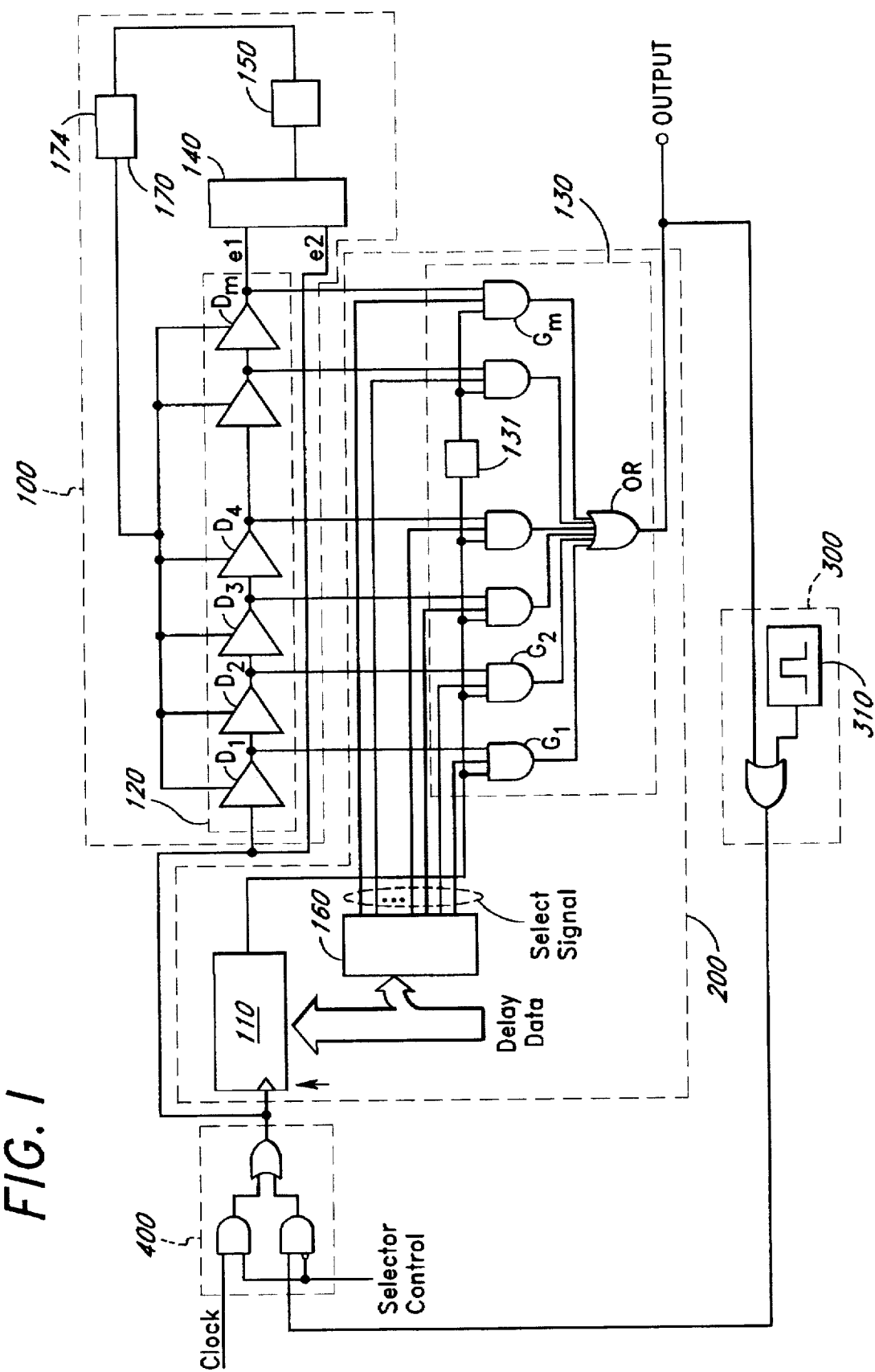
FIG. 1 is a circuit diagram showing an example of cirucit configuration of the timing signal generator of the present invention.
Figure 4:
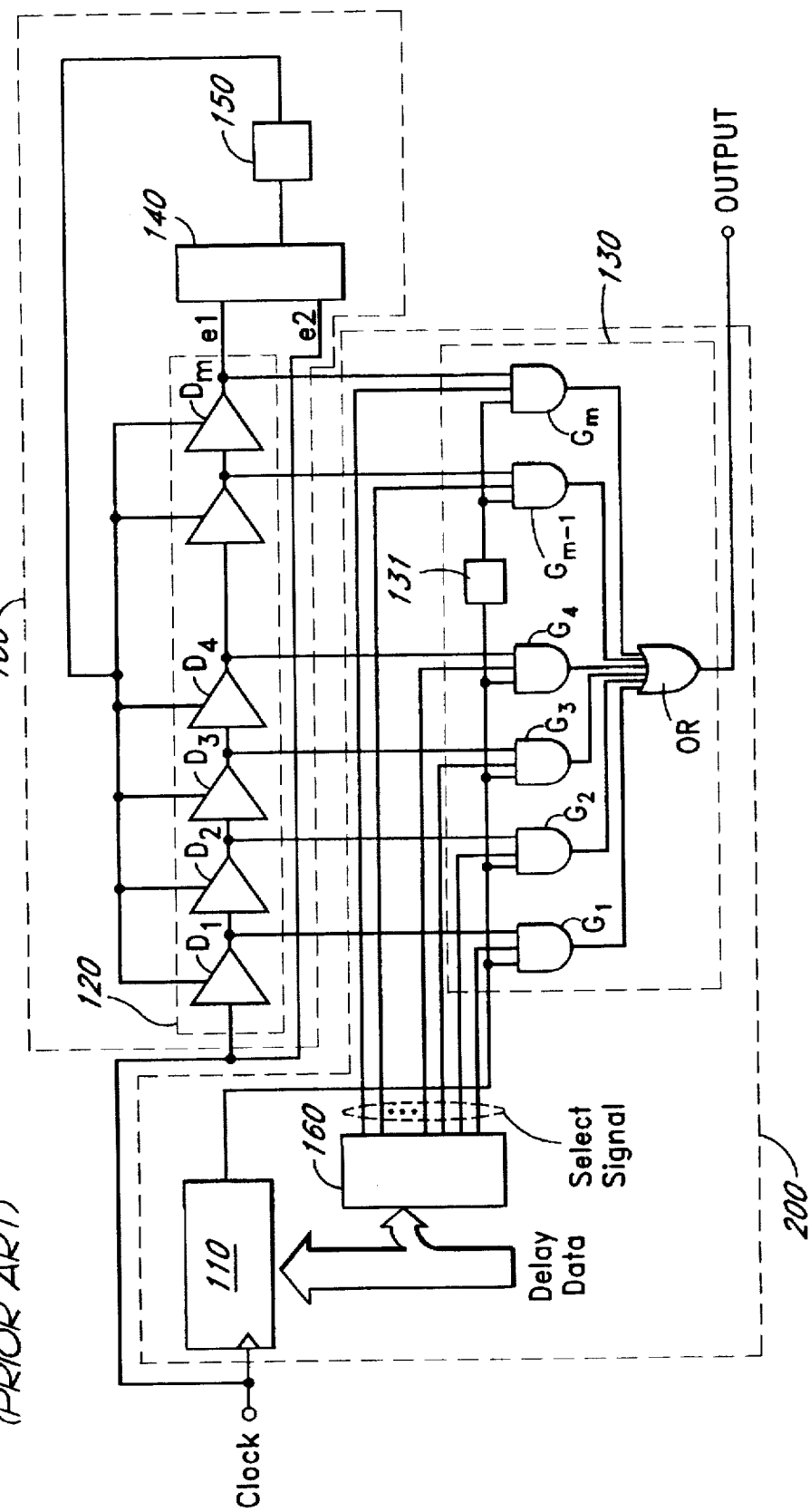
FIG. 4 is a circuit diagram showing a conventional cirucit configuration of the timing signal generator.
Figure 5:
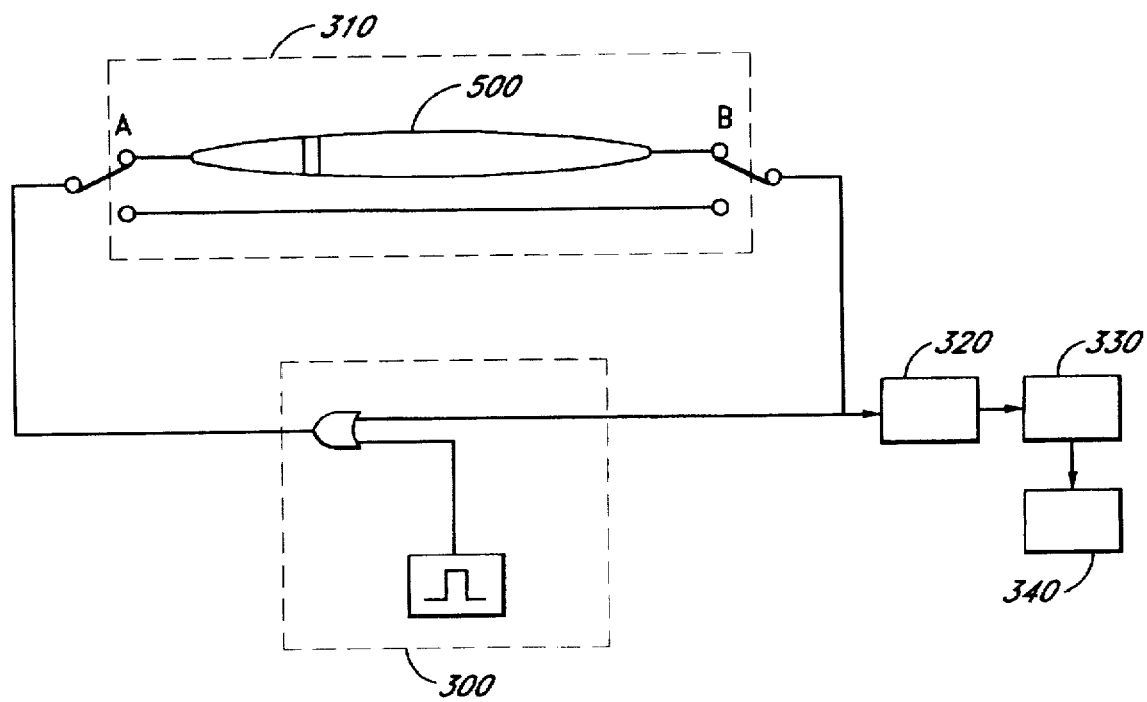
FIG. 5 is a schematic diagram for showing a principle of loop oscillation method.

FIG. 1 shows an example of timing signal generator of the present invention in which the same reference numerals and letters as used in FIG. 4 designate the corresponding parts of the timing signal generator. The timing signal generator of the present invention includes a phase lock loop circuit 100, a timing signal selection circuit 200, a pulse injection circuit 300 and an input selector circuit 400.

The phase lock loop circuit 100 includes a variable delay circuit 120 having m variable delay elements $D_1$-$D_m$ connected in series which receives a clock signal from the input selector circuit 400, a phase comparator 140 which detects a phase difference between an output signal from the variable delay circuit 120 and the clock signal, a feedback circuit 150 which produces a delay time control signal based on an output of the phase comparator 140 to control the delay of the variable delay circuit 120 and a track hold circuit 170 which provides the delay time control signal from the feedback circuit 150 to the delay elements $D_{1-m}$ in a phase lock mode and temporarily holds the delay time control signal in a loop oscillation mode.

In the phase lock mode, because of the feedback loop in the phase lock loop circuit 100 works to control the delay time of the variable delay circuit 120 to be equal to the clock signal based on the output of the phase comparator 140, the delay time of the variable delay circuit 120 becomes equal to one period of the clock signal. Thus, at each tap of the delay elements $D_1$-$D_m$, a signal having a delay time difference which is 1/m of the clock signal cycle will be established.

The timing signal selection circuit 200 includes a synchronous delay circuit 110 for receiving delay data which defines a timing of an output signal from the timing signal generator, and a decoder 160 which also receives the timing data, a selector circuit 130 having m selector gates $G_1$-$G_m$ to select one of m signals from the variable delay circuit 120 based on the selection signal from the decoder 160. In other words, each output of the delay elements $D_1$-$D_m$ is connected to an input of the corresponding selector gates $G_1$-$G_m$. The selector circuit 130 has an OR gate to receive one of the outputs of the selector gates $G_1$-$G_m$.

In the timing signal selection circuit 200, the synchronous delay circuit 110 outputs a large delay signal whose time interval is an integar multiple of the clock signal based on higher digits of the delay data. The large timing signal is provided to all of the selecor gates $G_1$-$G_m$. The decoder 160 generates a selection signal to select one of the outputs of the delay elements $D_1$-$D_m$ based on lower digits of the delay data.

Accordingly, the timing signal generator generates a timing signal having a delay time which is a sum of the large delay signal (integar multiple of the clock period) and a small delay signal (integar multiple of 1/m clock period) at the output of the OR gate. This timing signal generator is considered to be a simple, accurate, and cost effective timing signal generator to be used in a semiconductor test system such as an IC tester.

The foregoing operation is basically the same as that of the conventional timing signal generator of FIG. 4. By this arrangement, the delay time in the variable delay cirucit 120 is controlled to be equal to a time length of one cycle of the clock signal.

To measure actual delay time associated with each delay element, the timing signal generator of the present invention is set to the loop oscillation mode. In this mode, the input selector circuit 400 is switched by a selector control signal to inhibit the clock signal and receive a return pulse from the pulse injection circuit 300. The pulse injection circuit 300 provides an output signal from the selector circuit 130 to the input selector circuit which is then supplied to the variable delay circuit 120. In addition, the track hold circuit 170 temporarily holds and applies the output voltage from the feedback circuit 150 to the variable delay circuit 120 based on a track hold control signal.

Thus, in this mode, a closed loop including the variable delay circuit 120, the selector circuit 130, the pulse injection circuit 300 and the input selector circuit 400 will be established. The phase lock loop will not work in this mode, because the track hold circuit 170 holds the output voltage of the feedback circuit 150 and thus the voltage applied to the variable delay circuit 120 is unchanged, i.e., there is equal to no feedback control during this mode.

However, the voltage held by the track hold circuit is a control voltage in the phase lock loop immediately prior to the change of the modes. Thus, the delay time in the variable delay circuit 120 driven by the voltage supplied by the track hold circuit 170 is almost completely the same as the delay time in the phase lock mode. Further, the time length of the loop oscillation mode will be 1–100 milliseconds, which will not affect the delay time of the variable delay circuit 120. After the elapse of this time the phase lock loop operation is resumed by providing the control signal from the feedback circuit 150 to the variable delay circuit 120.

In the loop oscillation mode, a start pulse 310 is provided to the pulse injection circuit 300. The start pulse is a narrow, single pulse having, for example, a pulse width of 10 nanoseconds. The pulse injected in the closed loop passes through the input selector 400 and the variable delay circuit 120 and comes back to the pulse injection circuit 300 after a time delayed by the variable delay circuit. Thus, the oscillation starts in the closed loop whose frequency represents the delay time in the variable delay circuit 120. The oscillation frequency is measured by a frequency counter at the output of the timing signal generator.

By providing a select signal to the selector circuit 130 through the decoder 160, desired delay elements $D_1-D_m$ can be selected through one of the selector gates $G_1-G_m$ in the closed loop. The oscillation frequency will vary depending on the delay elements selected which represents the delay time of the selected delay elements. By this process, delay times of all the timing signals can be measured.

Figure 2:
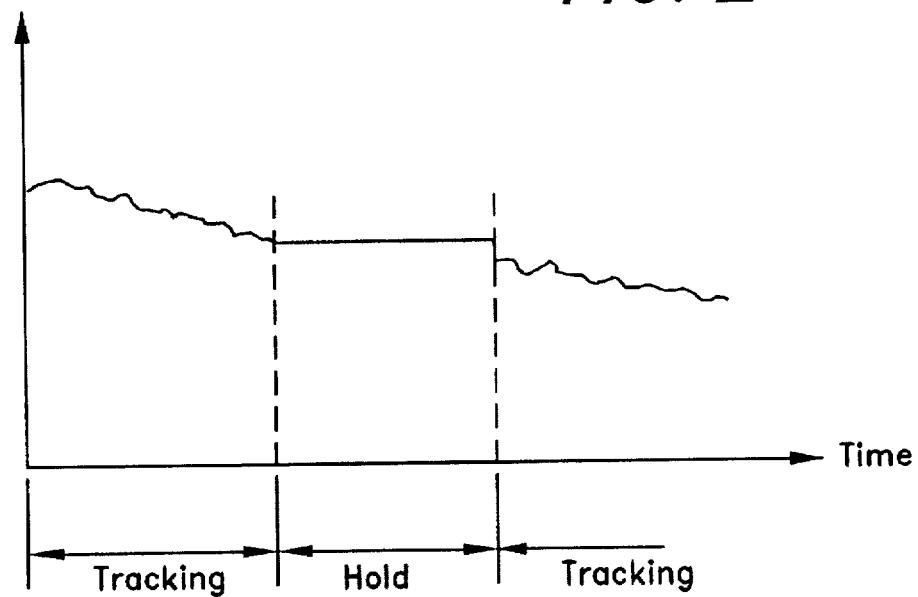
FIG. 2 is a schematic diagram showing an operation of the timing signal generator of the present invention.
Figure 6:
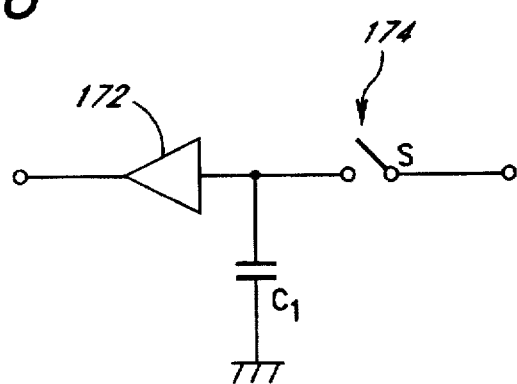
FIG. 6 is a circuit diagram showing an example of track hold circuit to be used in the present invention.

FIGS. 2 and 6 show an operation and structure of the track hold circuit 170 of the present invention. In FIG. 2, the phase lock control voltage in the phase lock mode is designated as "Tracking" and the control voltage temporarily held by the track hold circuit 170 in the loop oscillation mode is designated as "Hold". As noted above, the voltage in the "Hold" is substantially the same voltage of the phase lock control voltage immediately prior to the change to the loop oscillation mode. After measuring the oscillation frequency of the closed loop, the phase lock loop returns to the normal operation.

In FIG. 6, an example of the track hold circuit 170 is illustrated, which is a sample hold circuit well known in the art. The track hold circuit 170 includes a switch S, a capacitor C1 and a buffer amplifier 172. A track hold control signal 174 controls an open and close operation of the switch S. In the phase lock mode, the switch S is closed so that the input singnal is provided to the output of the buffer amplifier. In the loop oscillation mode, the switch is opened so that the input voltage charged in the capacitor C1 is held and provided to the variable delay circuit 120 for a certain period of time.

Figure 3:
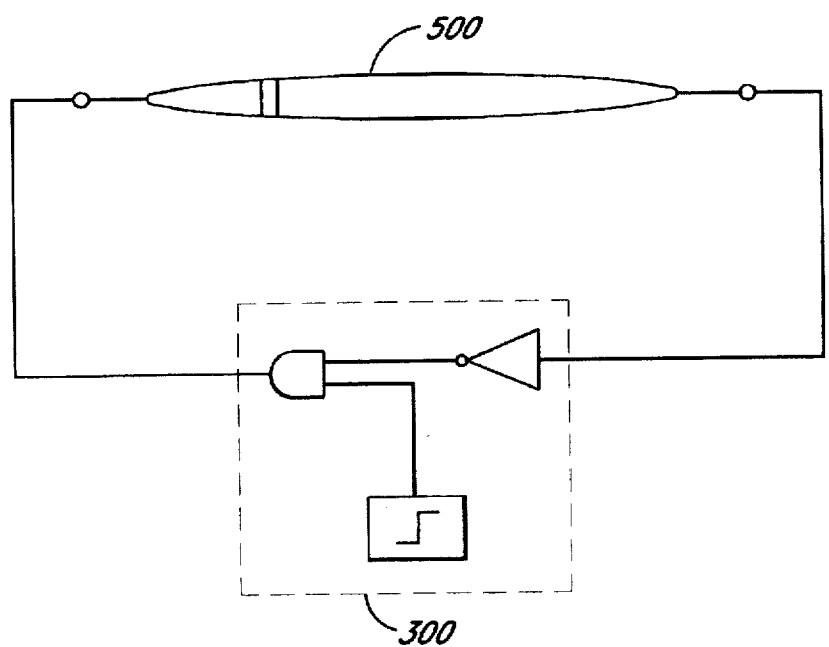
FIG. 3 is a schematic diagram for showing a principle of loop oscillation method.

In the foregoing explanation, a single pulse is used for starting the loop oscillation. It is also possible to use a step voltage signal to initiate the loop oscillation and to maintain the close loop as shown in FIG. 3. In the example of FIG. 3, the pulse injection circuit 300 is formed of an AND gate which is provided with a step voltage for starting the loop oscillation. When the step voltage is supplied, the AND gate remains open to form a closed loop.

As has been in the foregoing, according to the present invention, the timing signal generator having the variable delay circuit in the phase lock loop has the loop oscillation mode in which the variable delay circuit is provided with the control voltage from the track hold circuit. The control voltage represents the same voltage of the phase lock loop to attain the same delay time in the varible delay circuit in the phase lock mode.

Therefore, the timing signal generator of the present invention is capable of measuring the delay time of the variable delay circuit by the loop oscillation method. Further, the timing signal generator of the present invention is able to measure the delay time of the variable delay circuit with high accuracy in a short period of time with the use of the loop oscillation method.

What is claimed is:

1. A timing signal generator to be used in an IC tester for generating timing signals having timing resolution higher than a clock signal cycle, comprising:

a phase lock loop having a variable delay circuit which is formed of a plurality of delay elements connected in series wherein a delay time in said variable delay circuit is phase locked with a clock signal cycle;

a track hold circuit provided in said phase lock loop to transfer a phase lock control voltage to the phase lock loop in a phase lock mode and to temporarily hold said control voltage in a loop oscillation mode;

a selector circuit to select a timing signal from a plurality of signals corresponding to said plurality of delay elements in said variable delay circuit to produce said timing signal at a timing output;

an input selector for selectively providing a clock signal to said phase lock loop during said phase lock mode and a returning pulse from said timing output during said loop oscillation mode to form a closed loop which includes said variable delay circuit; and a pulse injection circuit for starting an oscillation in said closed loop by injecting a pulse signal in said closed loop.

2. A timing signal generator as defined in claim 1, wherein said phase lock loop includes a phase comparator for detecting a phase difference between said delay time of said variable delay circuit and said clock signal, and a feedback circuit which provides said control voltage to said variable delay circuit based on the phase difference detected by said phase comparator.

3. A timing signal generator as defined in claim 1, wherein said track hold circuit has a switch which opens for a short period of time in said loop oscillation mode to disconnect said phase lock loop, a capacitor which holds said control voltage when said switch opens, and a buffer amplifier which provides said control voltage to said variable delay circuit.

4. A timing signal generator as defined in claim 1, wherein said selector circuit further includes a plurality of selector gates each of which is arranged to receive an output of corresponding one of said delay elements in said variable delay circuit.

5. A timing signal generator as defined in claim 4, wherein said selector circuit further includes a synchronous delay circuit which receives said clock signal and produces a large timing signal which has a delay time equal to an integar multiple of said clock signal cycle, and a decoder which produces a select signal to be supplied to said selector gates.

6. A timing signal generator as defined in claim 1, wherein said pulse injection circuit includes an OR gate which transfers said returning pulse to said closed loop in said loop oscillation mode.

7. A timing signal generator as defined in claim 1, wherein said pulse injection circuit includes an AND gate which transfers said returning pulse to said closed loop in said loop oscillation mode when other input of said AND gate is provided with a step signal.

* * * * *